(12) United States Patent
Cho et al.

(10) Patent No.: US 12,278,311 B2
(45) Date of Patent: Apr. 15, 2025

(54) DISPLAY DEVICE USING SEMICONDUCTOR LIGHT EMITTING DIODE

(71) Applicant: LG ELECTRONICS INC., Seoul (KR)

(72) Inventors: Byoungkwon Cho, Seoul (KR); Junghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 511 days.

(21) Appl. No.: 17/641,291

(22) PCT Filed: Sep. 17, 2019

(86) PCT No.: PCT/KR2019/011958
§ 371 (c)(1),
(2) Date: Mar. 8, 2022

(87) PCT Pub. No.: WO2021/049692
PCT Pub. Date: Mar. 18, 2021

(65) Prior Publication Data
US 2022/0302351 A1 Sep. 22, 2022

(30) Foreign Application Priority Data

Sep. 9, 2019 (KR) .................. 10-2019-0111603

(51) Int. Cl.
*H01L 27/15* (2006.01)
*H01L 33/38* (2010.01)
*H01L 33/62* (2010.01)

(52) U.S. Cl.
CPC .......... *H01L 33/382* (2013.01); *H01L 27/156* (2013.01); *H01L 33/62* (2013.01)

(58) Field of Classification Search
CPC ............................................. H01L 2224/95101
See application file for complete search history.

(56) References Cited

U.S. PATENT DOCUMENTS

2005/0156183 A1 7/2005 Tsai et al.
2009/0101928 A1 4/2009 Kim et al.
(Continued)

FOREIGN PATENT DOCUMENTS

JP 2007-103690 A 4/2007
JP 2010-225852 A 10/2010
(Continued)

*Primary Examiner* — Evren Seven
(74) *Attorney, Agent, or Firm* — Birch, Stewart, Kolasch & Birch, LLP

(57) ABSTRACT

Discussed is a display device including: a base part; a plurality of assembly electrodes extending in a first direction and disposed at predetermined intervals on the base part; a dielectric layer stacked on the base part to cover the plurality of assembly electrodes; a barrier wall portion stacked on the dielectric layer to define a cell overlapping at least a portion of the plurality of assembly electrodes along the first direction of the plurality of assembly electrode; and a plurality of semiconductor light emitting devices disposed in the cell, wherein the plurality of semiconductor light emitting devices comprise a magnetic layer extending in a longitudinal direction that intersects the first direction.

20 Claims, 15 Drawing Sheets

(56) References Cited

U.S. PATENT DOCUMENTS

2013/0168708 A1\* 7/2013 Shibata ................. H01L 24/95
                                                                       257/88
2017/0077348 A1   3/2017 Lim et al.
2022/0336423 A1   10/2022 Kim et al.
2022/0415859 A1   12/2022 Choi et al.

FOREIGN PATENT DOCUMENTS

| KR | 10-2013-0033450 A | 4/2013 |
| KR | 10-2017-0033493 A | 3/2017 |
| KR | 10-2019-0075869 A | 7/2019 |
| KR | 10-2019-0085892 A | 7/2019 |
| KR | 10-2019-0097946 A | 8/2019 |
| KR | 10-2019-0099164 A | 8/2019 |

\* cited by examiner

[FIG. 1]
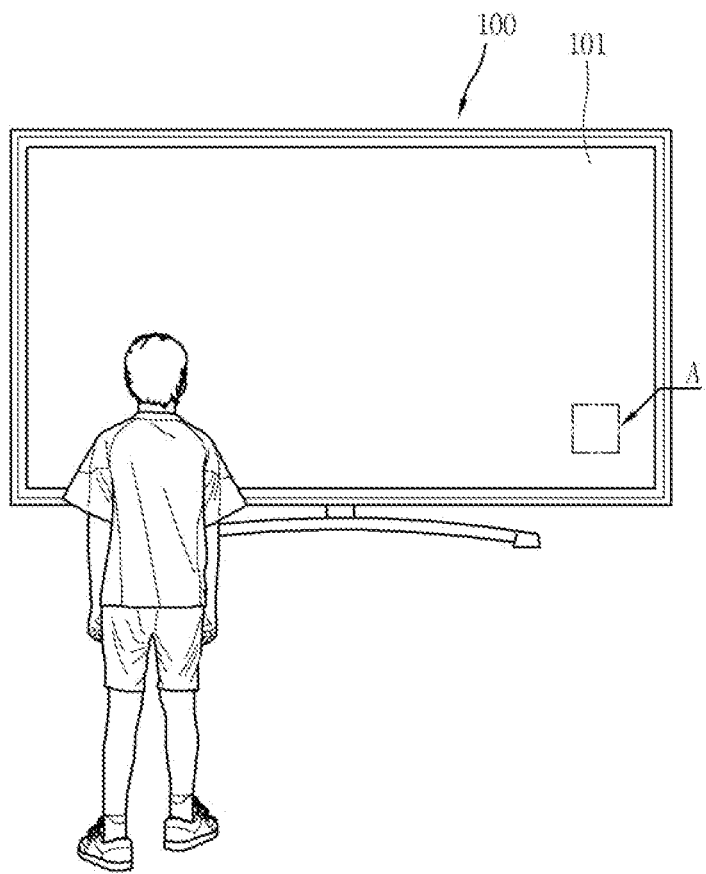

[FIG. 2]
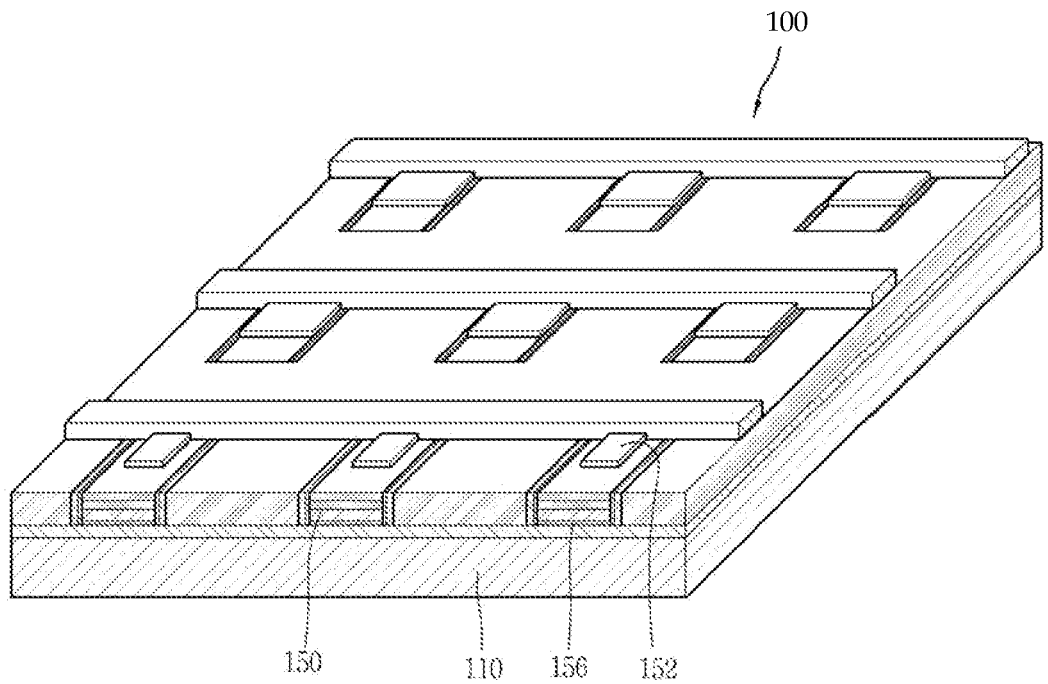
[FIG. 3]
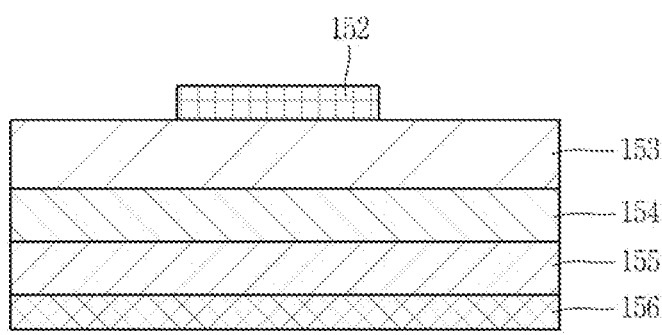

[FIG. 4]
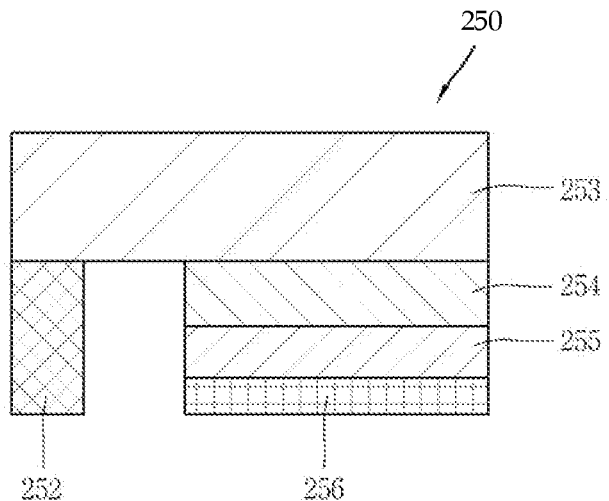
[FIG. 5A]
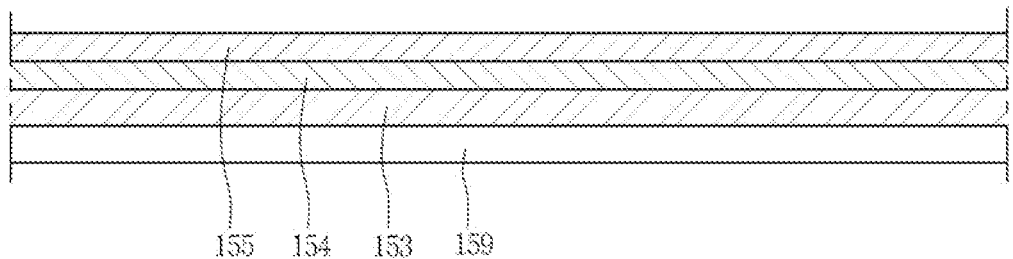
[FIG. 5B]
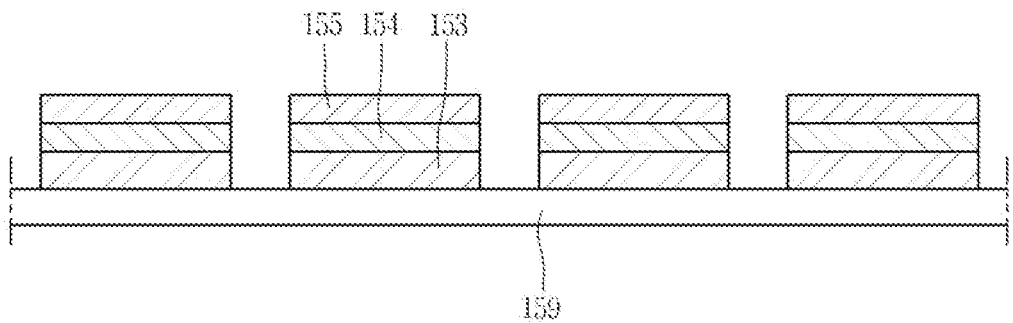

[FIG. 5C]
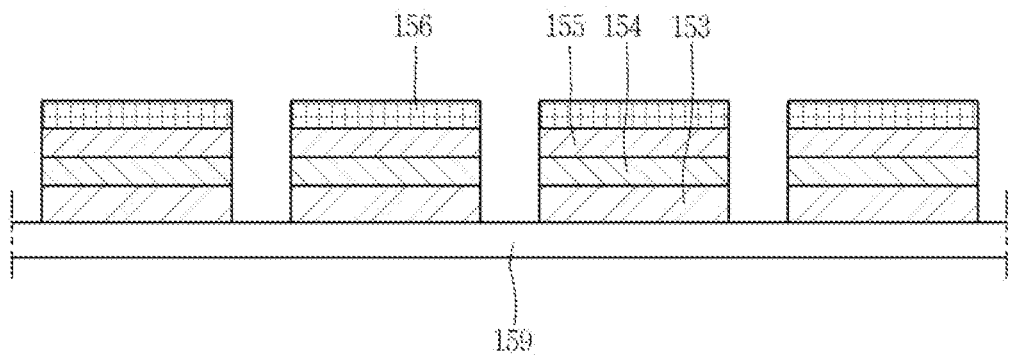
[FIG. 5D]
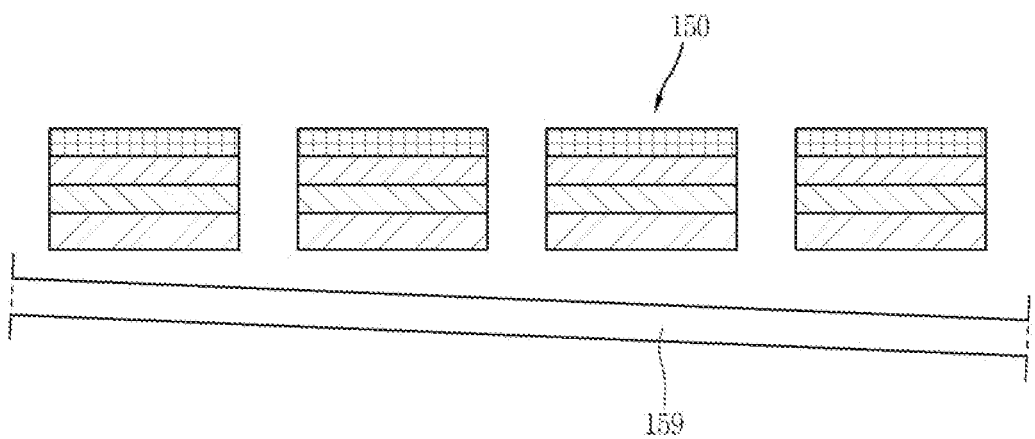
[FIG. 5E]
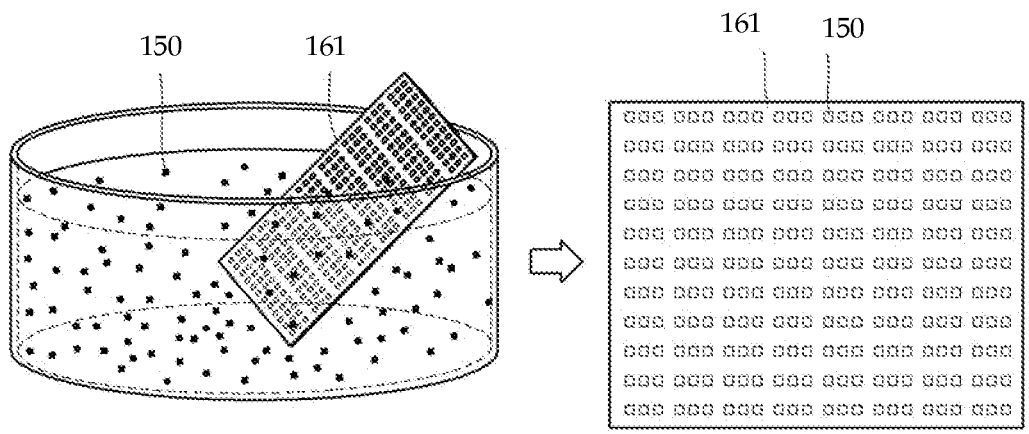

[FIG. 6]
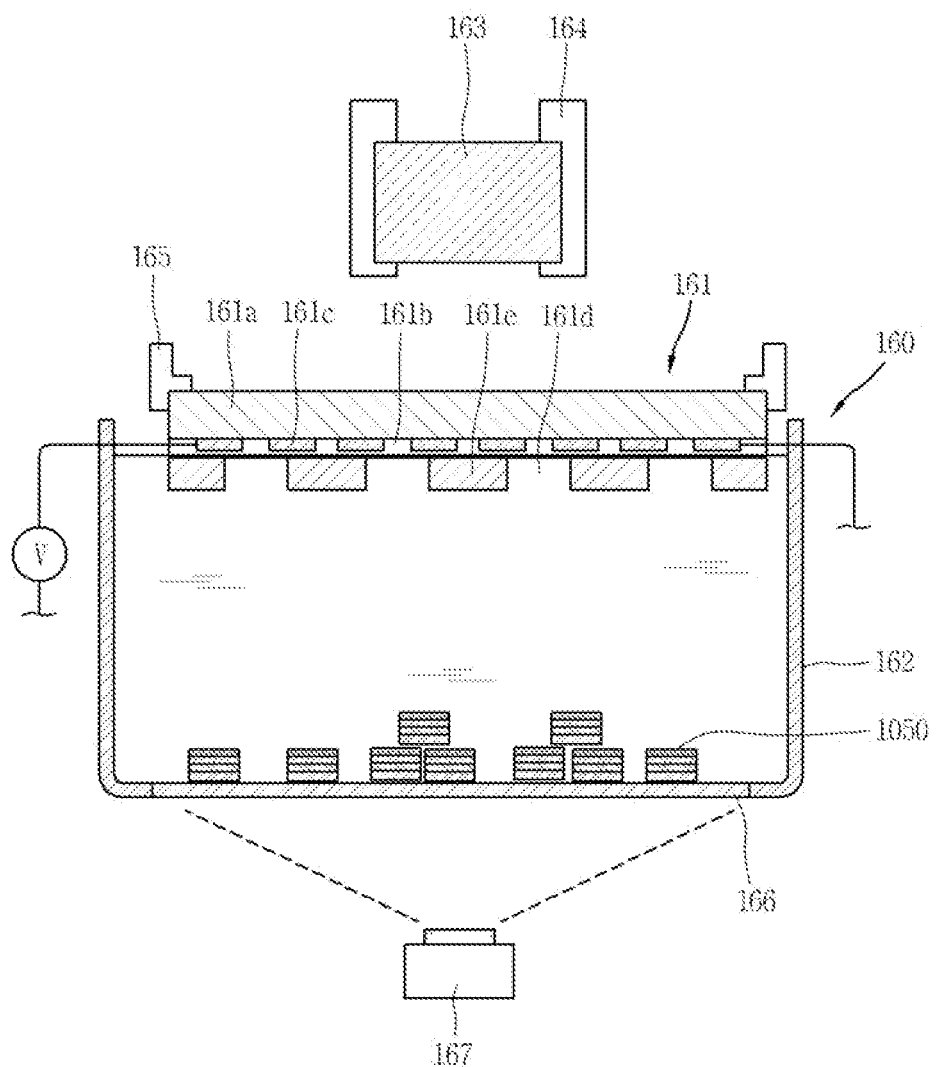

[FIG. 7]
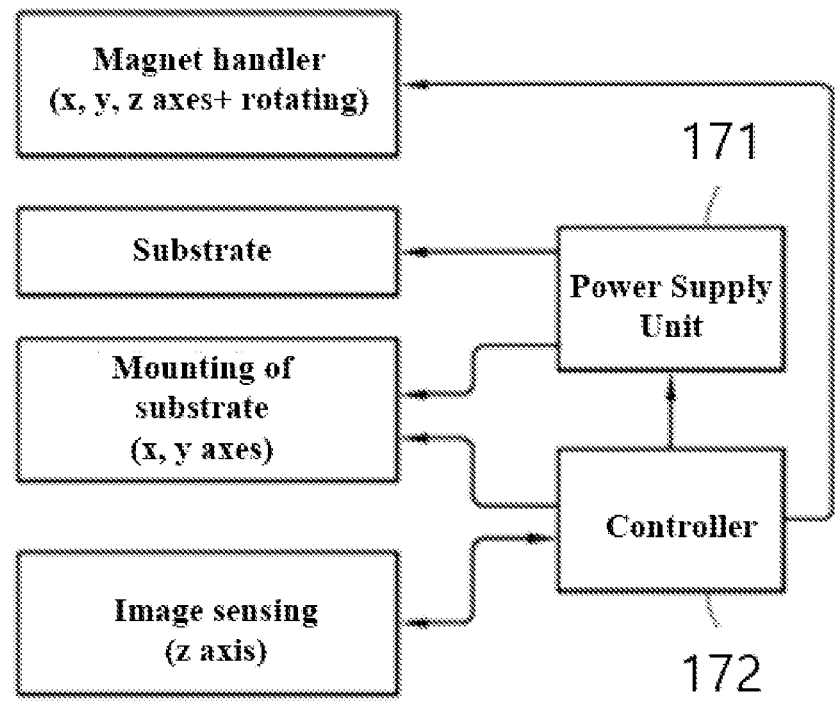
[FIG. 8A]
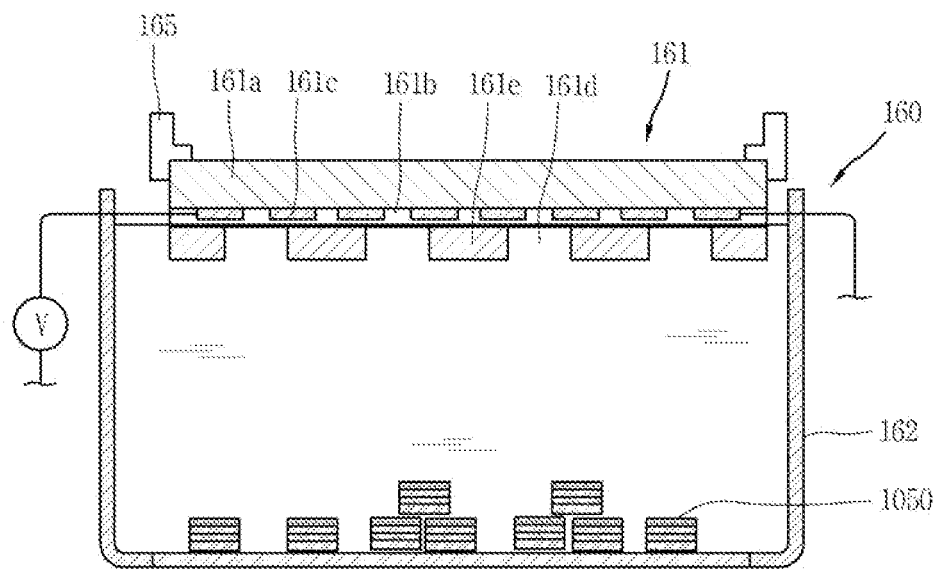

[FIG. 8B]
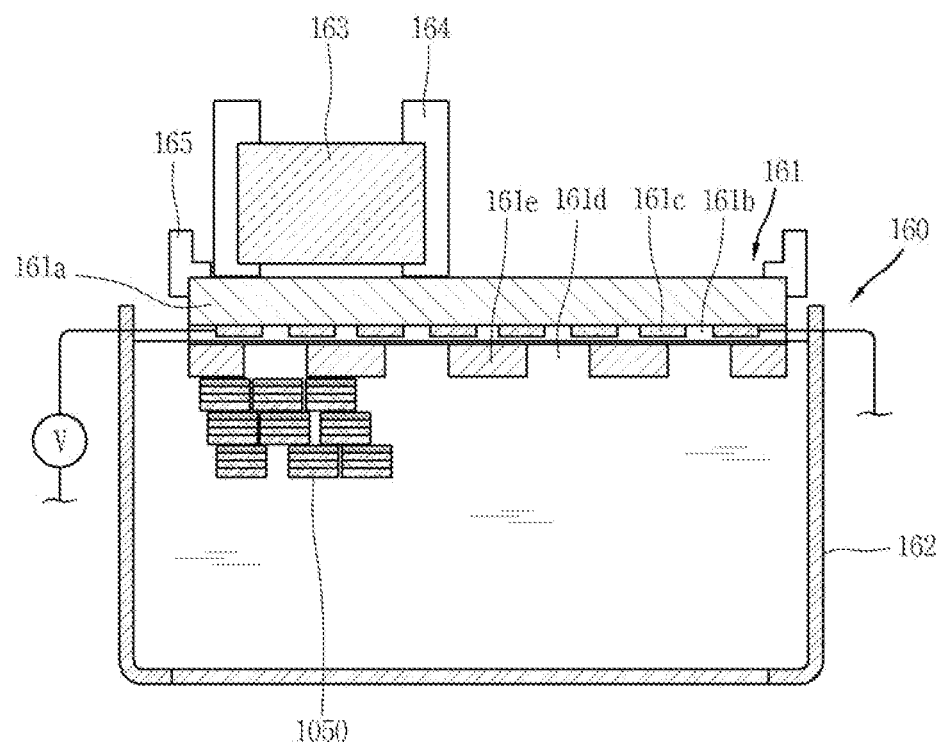

[FIG. 8C]
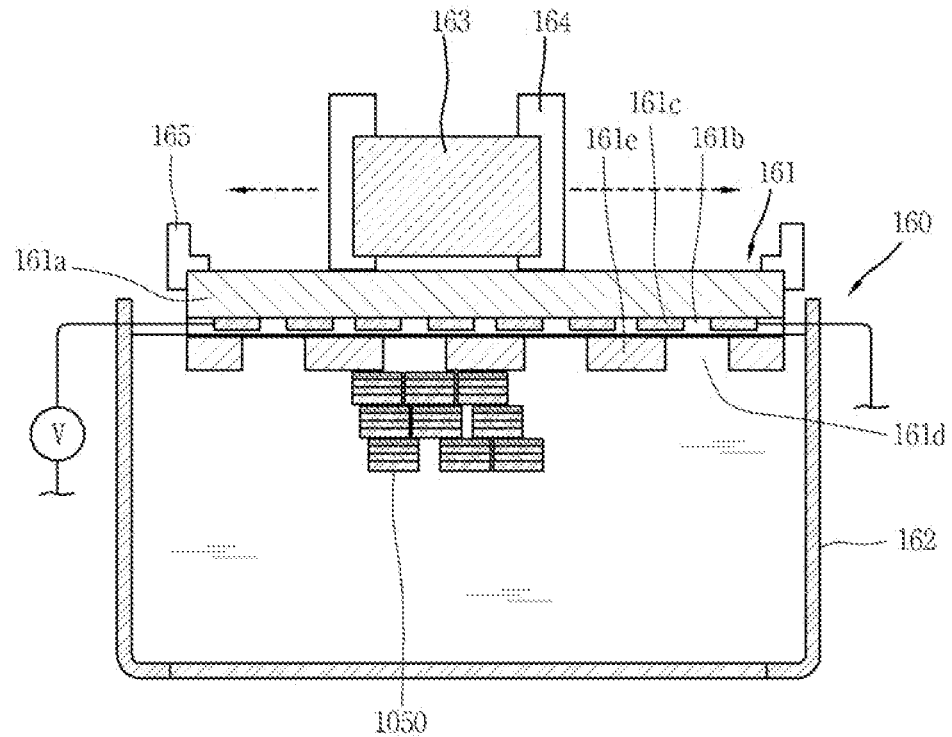
[FIG. 8D]
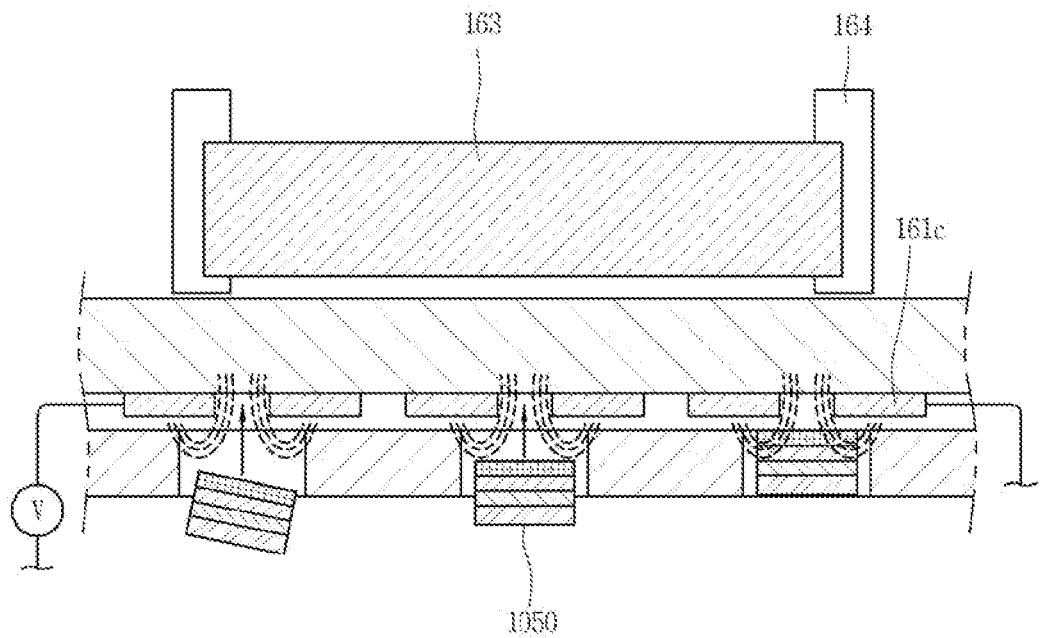

[FIG. 8E]
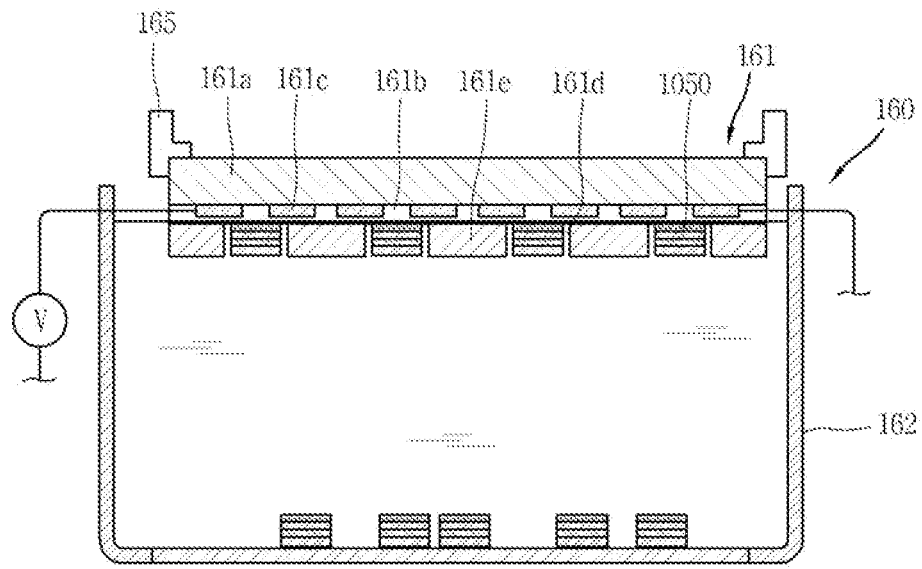
[FIG. 9]
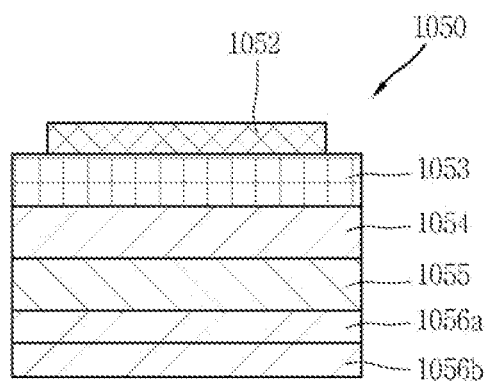

[FIG. 10]
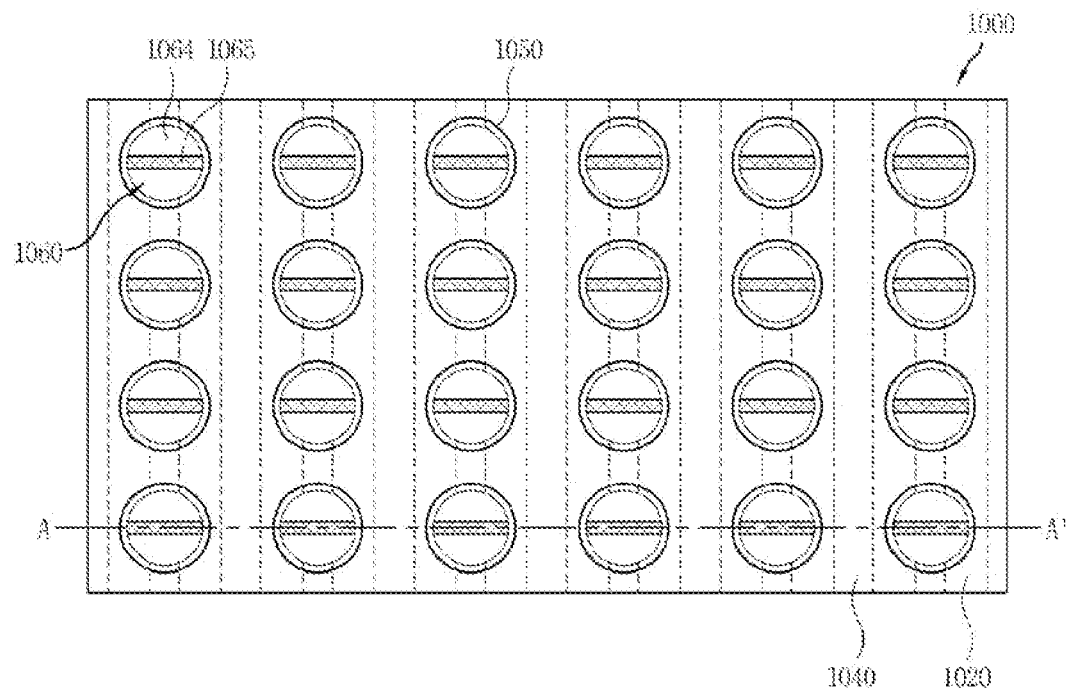

[FIG. 11A]
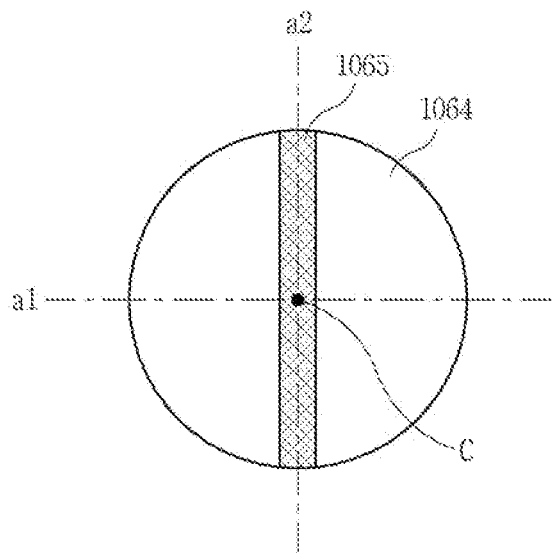
[FIG. 11B]
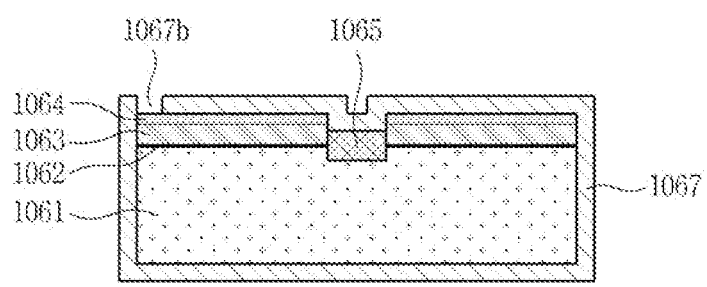

[FIG. 12]
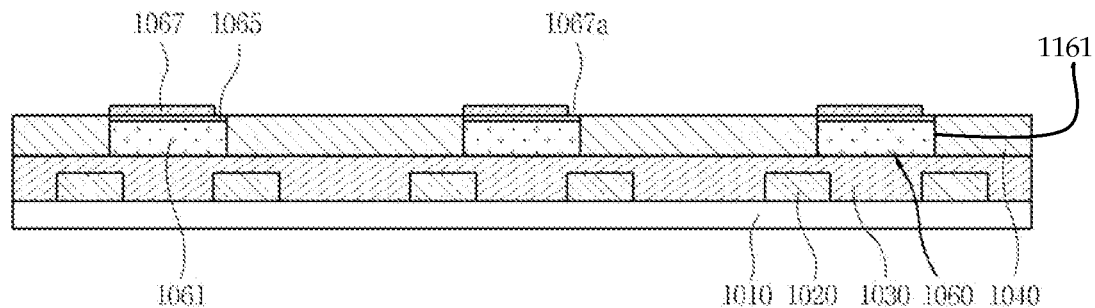
[FIG. 13]
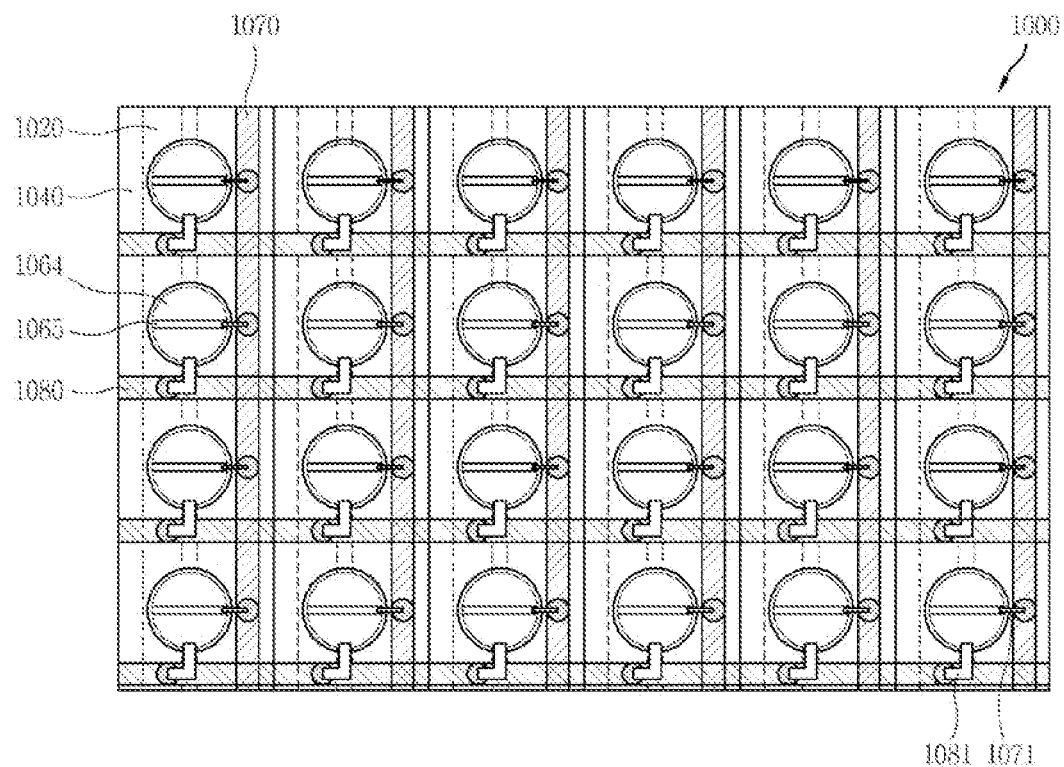

[FIG. 14A]
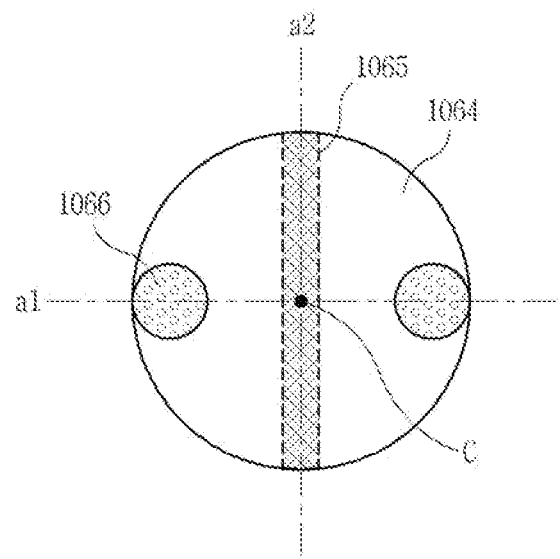
[FIG. 14B]
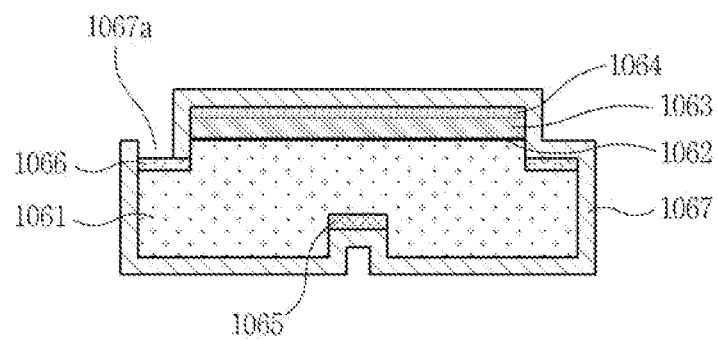

[FIG. 15]
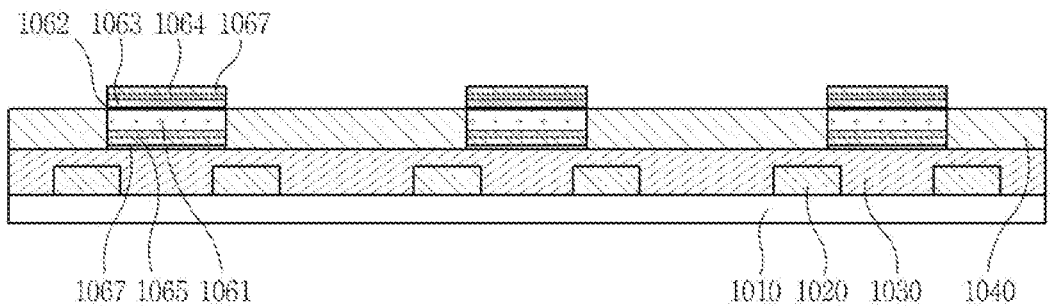
[FIG. 16]
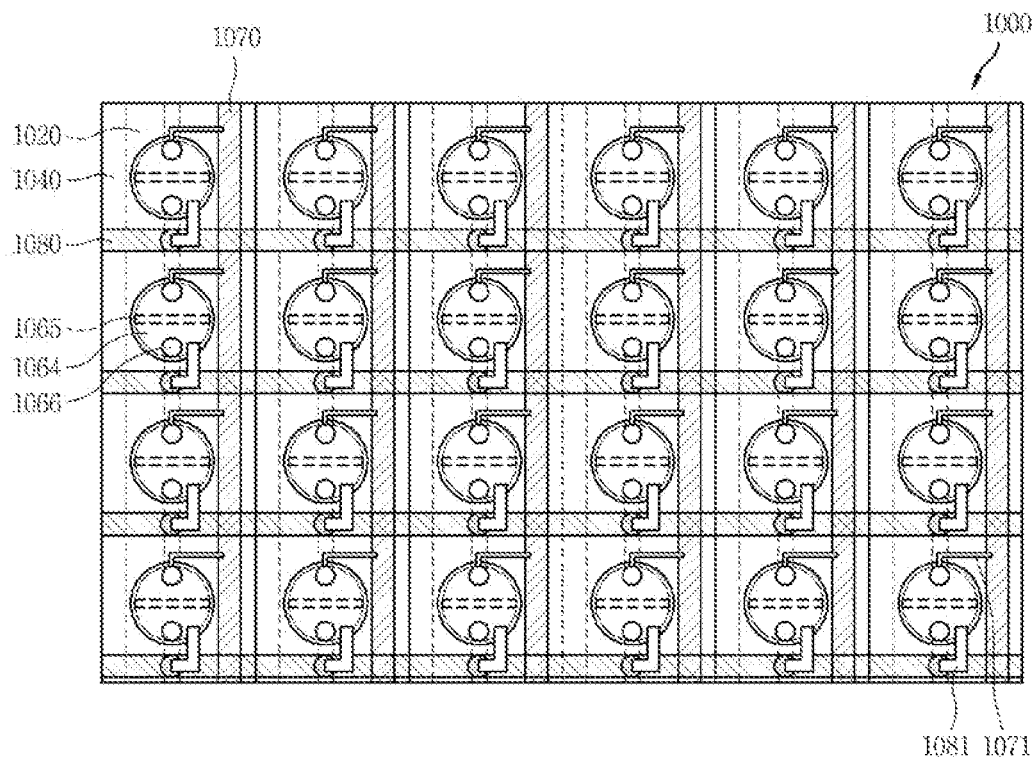

[FIG. 17A]
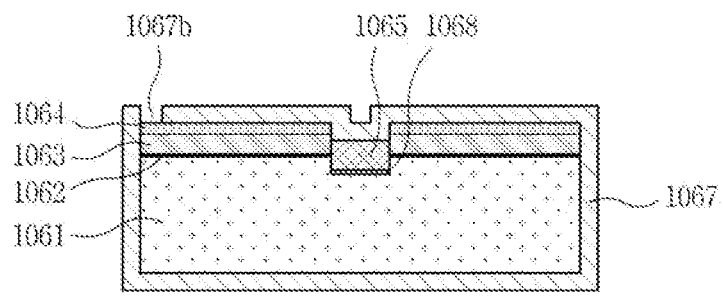
[FIG. 17B]
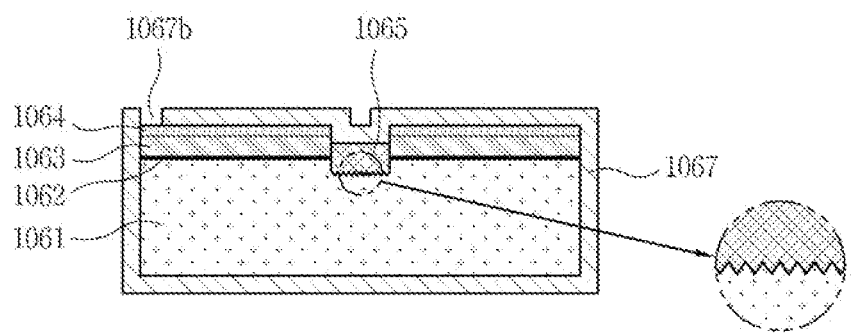
[FIG. 17C]
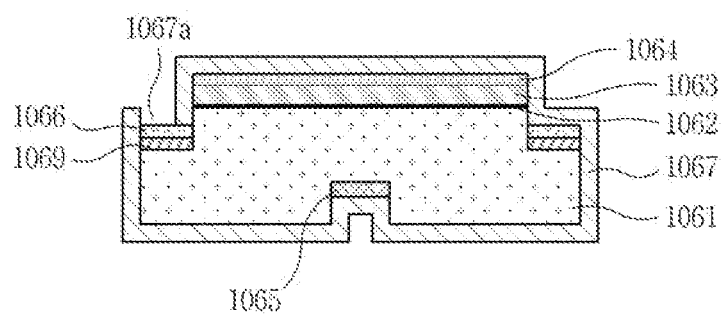

DISPLAY DEVICE USING SEMICONDUCTOR LIGHT EMITTING DIODE

CROSS REFERENCE TO RELATED APPLICATIONS

This application is the National Stage filing under 35 U.S.C. 371 of International Application No. PCT/KR2019/011958, filed on Sep. 17, 2019, which claims the benefit of earlier filing date and right of priority to Korean Application No. 10-2019-0111603, filed on Sep. 9, 2019 in the Republic of Korea, the contents of all these applications being hereby incorporated by reference into the present application.

TECHNICAL FIELD

The present invention relates to a display device using a semiconductor light emitting device, and more particularly, to a display device using a semiconductor light emitting device having a size of several to several tens of µm.

BACKGROUND ART

Recently, a liquid crystal displays (LCD), an organic light emitting device (OLED) displays, and a micro-LED display are competing to implement large-scale displays in the display technology field.

However, in the case of LCD, there are problems such as a slow response time and low efficiency of light generated by the backlight. Also, there are problems such as a short lifespan, poor mass production yield, and low efficiency exist regarding to OLED.

On the other hand, when a micro-LED, which is a semiconductor light emitting device having a diameter or cross-sectional area of 100 µm or less, is used in a display, the display doesn't absorb light using a polarizing plate, and therefore very high efficiency can be provided. However, since a large display requires millions of semiconductor light emitting devices, it is difficult to transfer the devices compared to other technologies.

The technologies currently being developed for the transfer process include pick & place, Laser Lift-off (LLO), or self-assembly. Among them, the self-assembly method is a method in which the semiconductor light emitting device finds its own position in a fluid, and is the most advantageous method for implementing a large-screen display device.

In the self-assembly method, there are a first method of directly assembling the semiconductor light emitting device to a final substrate on which wiring is formed and a second method of assembling the semiconductor light emitting device on a temporary substrate and transferring the semiconductor light emitting device to a final substrate on which wiring is formed through transfer. The first method is efficient in terms of process simplification and cost, and the second method has the advantage of adding a structure advantageous for self-assembly without limitation, and the two methods are selectively used.

On the other hand, horizontal semiconductor light emitting devices in which electrodes are spaced apart in the horizontal direction are mainly used for self-assembly. Such a semiconductor light emitting device must include a magnetic layer due to the characteristics of self-assembly and must be manufactured in a symmetrical structure. However, there is a limit to sufficiently securing a light emitting area under the above structure.

DISCLOSURE

Technical Problem

An object of the present invention is to provide a display device using a semiconductor light emitting device having a structure capable of securing sufficient light emitting area while being assembled on an assembly substrate in a predetermined direction through a self-assembly method.

Another object of the present invention is to provide a display device using a semiconductor light emitting device having improved light extraction efficiency.

Another object of the present invention is to provide a display device using a semiconductor light emitting device having improved bonding strength between magnetic layers.

Technical Solution

In this embodiment, it is characterized in that a display device using a semiconductor light emitting device may include a base part; a plurality of assembly electrodes extending in one direction and formed at predetermined intervals on the base part; a dielectric layer stacked on the base part to cover the assembly electrodes; a barrier wall portion stacked on the dielectric layer while forming a cell overlapping at least a portion of the assembly electrodes along the extending direction of the assembly electrode; and a plurality of semiconductor light emitting devices seated in the cell, and each of the semiconductor light emitting devices may include a magnetic layer extending in a longitudinal direction.

In this embodiment, it is characterized in that the semiconductor light emitting device may include a second conductivity type semiconductor layer; an active layer formed on a part of the second conductivity type semiconductor layer; and a first conductivity type semiconductor layer formed on the active layer, and the magnetic layer is formed on the second conductivity type semiconductor layer.

In the present embodiment, it is characterized in that the semiconductor light emitting device may include a symmetry plane among arbitrary surfaces extending along a stacking direction of the semiconductor light emitting device and the symmetry plane may pass through a central portion of the semiconductor light emitting device.

In this embodiment, it is characterized in that the symmetrical plane may extend in the same direction as the longitudinal direction of the magnetic layer.

In this embodiment, it is characterized in that the semiconductor light emitting device may include a first conductive electrode formed on the first conductivity type semiconductor layer, and may selectively include a second conductive electrode formed on the second conductivity type semiconductor layer.

In this embodiment, it is characterized in that the second conductive electrode may be formed on one surface of the second conductivity type semiconductor layer on which the active layer is formed, and the magnetic layer may be formed on other surface of the second conductivity type semiconductor layer opposite to the one surface. And this embodiment may include a first wiring electrode connecting the first conductive electrodes of the semiconductor light emitting devices arranged in a first direction; and a second wiring electrode connecting the second conductive electrodes of the semiconductor light emitting devices arranged in a second direction.

In this embodiment, it is characterized in that the magnetic layer may be formed on one surface of the second conductivity type semiconductor layer on which the active layer is formed, and may include a first wiring electrode connecting the first conductive electrodes of the semiconductor light emitting devices arranged in a first direction; and a second wiring electrode connecting the magnetic layers of the semiconductor light emitting devices arranged in a second direction.

In this embodiment, it is characterized in that when the semiconductor light emitting device includes only the first conductive electrode, at least one side of the magnetic layer may extend to an outer portion of the second conductivity type semiconductor layer.

In this embodiment, it is characterized in that the second conductive electrode may be formed on an outer portion of the second conductivity type semiconductor layer.

In the present embodiment, it is characterized in that an area of one surface on a side of the first conductive electrode of the semiconductor light emitting device is smaller than an area of other surface facing the one surface.

In this embodiment, it is characterized in that the semiconductor light emitting device may further include an auxiliary bonding layer between the magnetic layer and the second conductivity type semiconductor layer.

In this embodiment, it is characterized in that each of the magnetic layer and the second conductivity type semiconductor layer may include a concave-convex structure on surfaces facing each other.

In this embodiment, it is characterized in that the semiconductor light emitting device may further includes a reflective layer between the second conductive electrode and the second conductivity type semiconductor layer.

Advantageous Effects

According to the display device according to an embodiment of the present invention, during self-assembly, since the magnetic layer extending in the longitudinal direction included in the semiconductor light emitting device can be uniformly assembled in a direction perpendicular to the extending direction of the assembled electrodes disposed on the substrate, there is an effect that the assembly speed and assembly accuracy can be improved.

In addition, according to an embodiment of the present invention, since the electrode wiring can be performed by directly connecting the magnetic layer or by etching only a minimum area, it is possible to secure a large light emitting area, thereby enabling miniaturization of the semiconductor light emitting device.

In addition, according to an embodiment of the present invention, there is an effect of increasing the light extraction amount and light extraction efficiency by reflecting the light leaking from the side of the semiconductor light emitting device to a lower portion of the semiconductor light emitting device.

In addition, according to the embodiment of the present invention, there is an effect that can minimize a defect of the semiconductor light emitting device by improving an adhesive force of the magnetic layer.

DESCRIPTION OF DRAWINGS

FIG. 1 is a conceptual diagram showing an embodiment of a display device using a semiconductor light emitting device of the present invention.

FIG. 2 is a partially enlarged view of a portion A of the display device of FIG. 1.

FIG. 3 is an enlarged view of the semiconductor light emitting device of FIG. 2.

FIG. 4 is an enlarged view showing another embodiment of the semiconductor light emitting device of FIG. 2.

FIGS. 5A to 5E are conceptual views for explaining a new process for manufacturing the above-described semiconductor light emitting device.

FIG. 6 is a conceptual diagram illustrating an example of an apparatus for self-assembly of a semiconductor light emitting device according to the present invention.

FIG. 7 is a block diagram of the self-assembly apparatus of FIG. 6.

FIGS. 8A to 8E are conceptual views illustrating a process of self-assembling a semiconductor light emitting device using the self-assembling device of FIG. 6.

FIG. 9 is a conceptual diagram for explaining the semiconductor light emitting device of FIGS. 8A to 8E.

FIG. 10 is a view showing a display device in which a semiconductor light emitting device according to an embodiment of the present invention is assembled.

FIGS. 11A and 11B are views showing the structure of the semiconductor light emitting device according to the first embodiment of the present invention.

FIGS. 14A and 14B are views showing the structure of a semiconductor light emitting device according to a second embodiment of the present invention.

FIG. 13 is a diagram illustrating a wiring structure of a display device in which a semiconductor light emitting device according to a first embodiment of the present invention is assembled.

FIG. 14 is a view showing the structure of a semiconductor light emitting device according to a second embodiment of the present invention.

FIG. 15 is a view showing a display device in which a semiconductor light emitting device is assembled according to a second embodiment of the present invention, and is a cross-sectional view taken along line A-A' of FIG. 10.

FIG. 16 is a diagram illustrating a wiring structure of a display device in which a semiconductor light emitting device according to a second embodiment of the present invention is assembled.

FIGS. 17A to 17C are views showing the structure of a semiconductor light emitting device according to various embodiments of the present invention.

MODE FOR INVENTION

Hereinafter, the embodiments disclosed in the present specification will be described in detail with reference to the accompanying drawings, but the same or similar components are given the same reference numerals regardless of the reference numerals, and the redundant description thereof will be omitted. The suffixes "module" and "part" for components used in the following description are given or mixed in consideration of only the ease of writing the specification, and do not have a meaning or role distinct from each other by themselves. In addition, in describing the embodiments disclosed in the present specification, if it is determined that detailed descriptions of related known technologies may obscure the gist of the embodiments disclosed in the present specification, the detailed description thereof will be omitted. In addition, the accompanying drawings are only for easy understanding of the embodiments disclosed in the present specification, and should not be construed as limiting the technical idea disclosed herein by the accompanying drawings. Also, when an element, such as a layer, region, or substrate, is referred to as being "on" another component, it will be understood that this may be directly on other elements or intervening elements may exist in between.

The display device described in this specification may include a mobile phone, a smart phone, a laptop computer, a digital broadcasting terminal, a PDA (personal digital assistant), a PMP (portable multimedia player), a navigation, a slate PC, tablet PC (tablet PC), an Ultrabook, a Digital TV, a desktop computer, etc. However, the configuration according to the embodiment described in this specification can be applied as long as it can include a display even in a new product form to be developed later.

FIG. 1 is a conceptual diagram showing an embodiment of a display device using a semiconductor light emitting device of the present invention and FIG. 2 is a partial enlarged view of part A of the display device of FIG. 1. FIG. 3 is an enlarged view of the semiconductor light emitting device of FIG. 2, and FIG. 4 is an enlarged view showing another embodiment of the semiconductor light emitting device of FIG. 2.

As illustrated, information processed by the control unit of the display apparatus 100 may be output from the display module 140. A closed-loop case 101 surrounding an edge of the display module may form a bezel of the display device.

The display module 140 may include a panel 141 on which an image is displayed, the panel 141 may include a micro-sized semiconductor light emitting device 150 and a wiring board 110 on which the semiconductor light emitting device 150 is mounted.

A wiring may be formed on the wiring board 110 to be connected to the n-type electrode 152 and the p-type electrode 156 of the semiconductor light emitting device 150. Through this, the semiconductor light emitting device 150 may be provided on the wiring board 110 as an individual pixel that emits light.

The image displayed on the panel 141 is visual information, and is implemented by independently controlling the light emission of sub-pixels arranged in a matrix form through the wiring.

In the present invention, a micro-LED (Light Emitting Diode) is exemplified as a type of the semiconductor light emitting device 150 that converts current into light. The micro-LED may be a light emitting diode formed in a small size of 100 micrometers or less. In the semiconductor light emitting device 150, blue, red, and green colors are respectively provided in the light emitting region, and a unit pixel may be implemented by a combination thereof. That is, the unit pixel means a minimum unit for implementing one color, and at least three micro-LEDs may be provided in the unit pixel.

More specifically, referring to FIG. 3, the semiconductor light emitting device 150 may have a vertical structure.

For example, the semiconductor light-emitting device 150 may be implemented as a high-output light-emitting device that emits various types of light, including blue, by mainly using gallium nitride (GaN) and adding indium (In) and/or aluminum (Al) together.

This vertical semiconductor light emitting device includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the lower p-type electrode 156 may be electrically connected to the p-electrode of the wiring board, and the upper n-type electrode 152 may be electrically connected to the n-electrode at the upper side of the semiconductor light emitting device. The vertical semiconductor light emitting device 150 has a great advantage in that it is possible to reduce the chip size because electrodes can be arranged up and down.

As another example, referring to FIG. 4, the semiconductor light emitting device may be a flip chip type light emitting device.

In this example, the semiconductor light emitting device 250 includes a p-type electrode 256, a p-type semiconductor layer 255 on which the p-type electrode 256 is formed, an active layer 254 formed on the p-type semiconductor layer 255, An n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and the n-electrode of the wiring board under the semiconductor light emitting device.

The vertical semiconductor light emitting device and the horizontal semiconductor light emitting device may be a green semiconductor light emitting device, a blue semiconductor light emitting device, or a red semiconductor light emitting device, respectively. In the case of the green semiconductor light emitting device and the blue semiconductor light emitting device, Gallium nitride (GaN) may be mainly used, and indium (In) and/or aluminum (Al) may be added together, high-output light emitting devices emitting green light or blue light may be implemented. For this example, the semiconductor light emitting device may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of a red semiconductor light emitting device, the p-type semiconductor layer may be P-type GaAs, and the n-type semiconductor layer may be N-type GaAs.

Also, the p-type semiconductor layer may be P-type GaN doped with Mg on the p-electrode side, and the n-type semiconductor layer may be N-type GaN doped with Si on the n-electrode side. In this case, the above-described semiconductor light emitting devices may be semiconductor light emitting devices without an active layer.

Meanwhile, referring to FIGS. 1 to 4, since the light emitting diode is very small, unit pixels that emit self-luminescence can be arranged in a high definition in the display panel, thereby implementing a high-definition display device.

In the display device using the semiconductor light emitting device of the present invention described above, the semiconductor light emitting device grown on a wafer and formed through mesa and isolation is used as an individual pixel. In this case, the micro-sized semiconductor light emitting device 150 is to be transferred to a predetermined position on the substrate of the display panel on the wafer. There is a pick and place method as such a transfer technology, but the success rate is low and a lot of time is required. As another example, there is a technique of transferring several devices at once using a stamp or a roll, but there is a limit to the yield, so it is not suitable for a large screen display. The present invention proposes a new manufacturing method and manufacturing apparatus of a display device that can solve these problems.

For this purpose, hereinafter, a new method of manufacturing a display device will be described. FIG. 5A to 5E are conceptual views for explaining a new process of manufacturing the above-described semiconductor light emitting device.

In this specification, a display device using a passive matrix (PM) type semiconductor light emitting device is exemplified. However, the examples described below are also applicable to an active matrix (AM) type semiconductor light emitting device. In addition, although a method of self-assembling a horizontal semiconductor light emitting device is exemplified, it is also applicable to a method of self-assembling a vertical semiconductor light emitting device.

First, according to the manufacturing method, the first conductivity type semiconductor layer 153, the active layer 154, and the second conductivity type semiconductor layer 155 may be grown on the growth substrate 159, respectively (FIG. 5A).

When the first conductivity type semiconductor layer 153 is grown, next, an active layer 154 is grown on the first conductivity type semiconductor layer 153, next, a second conductivity type semiconductor layer 155 is grown on the active layer 154. In this way, when the first conductivity type semiconductor layer 153, the active layer 154, and the second conductivity type semiconductor layer 155 may be sequentially grown, as shown in FIG. 5A, the first conductivity type semiconductor layer 153, the active layer 154, and the second conductivity type semiconductor layer 155 may form a stacked structure.

In this case, the first conductivity type semiconductor layer 153 may be a p-type semiconductor layer, and the second conductivity type semiconductor layer 155 may be an n-type semiconductor layer. However, the present invention is not necessarily limited thereto, and examples in which the first conductivity type is n-type and the second conductivity type is p-type are also possible.

In addition, although the present embodiment exemplifies the case in which the active layer is present, a structure in which the active layer is not present is also possible in some cases as described above. For this example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al₂O₃), GaN, ZnO, and AlO, but is not limited thereto. In addition, the growth substrate 1059 may be formed of a material suitable for semiconductor material growth, a carrier wafer. It may be formed of a material having excellent thermal conductivity, including a conductive substrate or an insulating substrate. For example, at least one of Si, GaAs, GaP, InP, and Ga₂O₃ or a SiC substrate having higher thermal conductivity than a sapphire (Al₂O₃) substrate may be used.

Next, at least some portions of the first conductivity type semiconductor layer 153, the active layer 154, and the second conductivity type semiconductor layer 155 are removed to form a plurality of semiconductor light emitting devices ((refer to FIG. 5B).

More specifically, an isolation may be performed so that a plurality of light emitting devices form a light emitting device array. That is, the first conductivity type semiconductor layer 153, the active layer 154, and the second conductivity type semiconductor layer 155 may be vertically etched to form a plurality of semiconductor light emitting devices.

If a horizontal type semiconductor light emitting device is formed, the active layer 154 and the second conductivity type semiconductor layer 155 are partially removed in the vertical direction, so that the first conductivity type semiconductor layer 153 is exposed to the outside in a mesa process, thereafter, isolation of forming a plurality of semiconductor light emitting device arrays by etching the first conductivity type semiconductor layer may be performed.

Next, second conductive electrodes 156 (or p-type electrodes) are respectively formed on one surface of the second conductivity type semiconductor layer 155 ((refer to FIG. 5C). The second conductive electrode 156 may be formed by a deposition method such as sputtering, but the present invention is not limited thereto. However, when the first conductivity type semiconductor layer and the second conductivity type semiconductor layer are an n-type semiconductor layer and a p-type semiconductor layer respectively, the second conductive electrode 156 may be an n-type electrode.

Next, the growth substrate 159 may be removed to provide a plurality of semiconductor light emitting devices. For example, the growth substrate 1059 may be removed using a laser lift-off (LLO) method or a chemical lift-off (CLO) method ((refer to FIG. 5D).

Thereafter, a step of seating the semiconductor light emitting devices 150 on a substrate in a chamber filled with a fluid is performed (FIG. 5E).

For example, the semiconductor light emitting devices 150 and the substrate are put in a chamber filled with a fluid, and the semiconductor light emitting devices may be self-assembled on the substrate-1061 161 using flow, gravity, surface tension, and the like. In this case, the substrate may be the assembly substrate 161.

As another example, it is also possible to put a wiring board in a fluid chamber instead of the assembly board 161 so that the semiconductor light emitting devices 150 may be directly seated on the wiring board. In this case, the substrate may be a wiring substrate. However, for convenience of description, in the present invention, the substrate is provided as the assembly substrate 161 to exemplify that the semiconductor light emitting devices 150 are seated.

Cells (not shown) in which the semiconductor light emitting devices 150 are inserted may be provided on the assembly substrate 161 to facilitate assembling of the semiconductor light emitting devices 150 on the assembly substrate 161. Specifically, cells in which the semiconductor light emitting devices 150 are seated are formed on the assembly substrate 161 at positions where the semiconductor light emitting devices 150 are aligned with the wiring electrodes. The semiconductor light emitting devices 150 are assembled to the cells while moving in the fluid.

When a plurality of semiconductor light emitting devices are arrayed on the assembling board 161 and then transferring the semiconductor light emitting devices of the assembling board 161 to a wiring board, large-area transfer is possible. Accordingly, the assembly substrate 161 may be referred to as a temporary substrate.

On the other hand, in order to apply the self-assembly method described above to the manufacture of a large-screen display, it is necessary to increase the transfer yield. The present invention proposes a method and apparatus for minimizing the influence of gravity or frictional force and preventing non-specific binding in order to increase the transfer yield.

In this case, in the display device according to the present invention, a magnetic material is disposed on the semiconductor light emitting device to move the semiconductor light emitting device using magnetic force, and the semiconductor light emitting device is seated at a preset position using an electric field during the movement process. Hereinafter, such a transfer method and apparatus will be described in more detail with the accompanying drawings.

FIG. 6 is a conceptual diagram illustrating an example of a self-assembly apparatus of a semiconductor light emitting device according to the present invention, and FIG. 7 is a block diagram of the self-assembly apparatus of FIG. 6. In addition, FIGS. 8A to 8D are conceptual views illustrating a process of self-assembling a semiconductor light emitting device using the self-assembly apparatus of FIG. 6, and FIG. 9 is a conceptual diagram illustrating the semiconductor light emitting device of FIGS. 8A to 8D.

Referring to FIGS. 6 and 7, the self-assembly apparatus 160 of the present invention may include a fluid chamber 162, a magnet 163, and a position control unit 164.

The fluid chamber 162 may have a space for accommodating a plurality of semiconductor light emitting devices. The space may be filled with a fluid, and the fluid may include water as an assembly solution. Accordingly, the fluid chamber 162 may be a water tank, and may be configured as an open type. However, the present invention is not limited thereto, and the fluid chamber 162 may be of a closed type in which the space is a closed space.

The substrate 161 may be disposed in the fluid chamber 162 so that the assembly surface on which the semiconductor light emitting devices 150 are assembled faces downward. For example, the substrate 161 may be transferred to an assembly position by a transfer unit, and the transfer unit may include a stage 165 on which the substrate is mounted. The position of the stage 165 is adjusted by the controller, and through this, the substrate 161 can be transferred to the assembly position.

At this time, the assembly surface of the substrate 161 faces the bottom of the fluid chamber 162 in the assembly position. As shown, the assembly surface of the substrate 161 is arranged to be immersed in the fluid in the fluid chamber 162. Accordingly, the semiconductor light emitting device 150 moves to the assembly surface in the fluid.

The substrate 161 is an assembled substrate capable of forming an electric field, and may include a base portion 161a, a dielectric layer 161b, and a plurality of electrodes 161c.

The base portion 161a may be formed of an insulating material, and the plurality of electrodes 161c may be thin film or thick film bi-planar electrodes patterned on one surface of the base portion 161a. The electrode 161c may be formed of, for example, a stack of Ti/Cu/Ti, Ag paste, ITO, or the like.

The dielectric layer 161b may be formed of an inorganic material such as $SiO_2$, SiNx, SiON, $Al_2O_3$, $TiO_2$, $HfO_2$. Alternatively, the dielectric layer 161b may be formed of a single layer or a multi-layer as an organic insulator. The dielectric layer 161b may have a thickness of several tens of nm to several μm.

Furthermore, the substrate 161 according to the present invention may include a plurality of cells 161d partitioned by barrier wall. The cells 161d may be sequentially arranged in one direction and may be made of a polymer material. Also, the barrier wall 161e forming the cells 161d may be shared with the neighboring cells 161d. The barrier wall 161e may protrude from the base part 161a, and the cells 161d may be sequentially disposed along one direction by the partition wall 161e. More specifically, the cells 161d may be sequentially arranged in the column and row directions, respectively, and may have a matrix structure.

Inside the cells 161d, as shown, a groove for accommodating the semiconductor light emitting device 150 may be provided, and the groove may be a space defined by the barrier wall 161e. The shape of the groove may be the same as or similar to that of the semiconductor light emitting device. For example, when the semiconductor light emitting device has a rectangular shape, the groove may have a rectangular shape. Also, although not shown, when the semiconductor light emitting device has a circular shape, the grooves formed in the cells may have a circular shape. Furthermore, each of the cells is configured to accommodate a single semiconductor light emitting device. That is, one semiconductor light emitting device is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c may be disposed below the cells 161d, and different polarities may be applied to each other to generate an electric field in the cells 161d. To form the electric field, the dielectric layer may form the bottom of the cells 161d while covering the plurality of electrodes 161c with the dielectric layer. In this structure, when different polarities are applied to the pair of electrodes 161c under each of the cells 161d, an electric field is formed, and the semiconductor light emitting device can be inserted into the cells 161d by the electric field.

In the assembly position, the electrodes of the substrate 161 are electrically connected to the power supply unit 171. The power supply unit 171 applies power to the plurality of electrodes to generate the electric field.

As shown, the self-assembly apparatus may include a magnet 163 for applying a magnetic force to the semiconductor light emitting devices. The magnet 163 may be spaced apart from the fluid chamber 162 to apply a magnetic force to the semiconductor light emitting devices 150. The magnet 163 may be disposed to face the opposite surface of the assembly surface of the substrate 161, and the position of the magnet may be controlled by the position controller 164 connected to the magnet 163.

The semiconductor light emitting device 1050 may include a magnetic material to move in the fluid by the magnetic field of the magnet 163.

Referring to FIG. 9, a semiconductor light emitting device including a magnetic material may include a first conductive electrode 1052, a second conductive electrode 1056, a first conductivity type semiconductor layer 1053 on which the first conductive electrode 1052 is disposed, a second conductivity type semiconductor layer 1055 overlapping the first conductivity type semiconductor layer 1052 and on which the second conductive electrode 1056 is disposed and an active layer 1054 disposed between the first and second conductivity type semiconductor layers 1053 and 1055.

Here, the first conductivity type may be a p-type, and the second conductivity type may be configured as an n-type, and vice versa. Also, as described above, the semiconductor light emitting device without the active layer may be used.

Meanwhile, in the present invention, the first conductive electrode 1052 may be generated after the semiconductor light emitting device is assembled on the wiring board by self-assembly of the semiconductor light emitting device. Also, in the present invention, the second conductive electrode 1056 may include the magnetic material. The magnetic material may mean a magnetic metal. The magnetic material may be Ni, SmCo, or the like, and as another example, may include a material corresponding to at least one of Gd-based, La-based, or Mn-based materials.

The magnetic material may be provided in the second conductive electrode 1056 in the form of particles. Alternatively, in a conductive electrode including a magnetic material, one layer of the conductive electrode may be formed of a magnetic material.

As shown, in this example, the first layer 1056a including a magnetic material may be disposed to contact the second conductivity type semiconductor layer 1055. In this case, the first layer 1056a may be disposed between the second layer 1056b and the second conductivity type semiconductor layer 1055. The second layer 1056b may be a contact metal connected to the second electrode of the wiring board. However, the present invention is not necessarily limited thereto, and the magnetic material may be disposed on one surface of the first conductivity type semiconductor layer.

Referring back to FIGS. 6 and 7, more specifically, the self-assembly apparatus may include a magnet handler capable of automatically or manually moving the x, y, and z axes on the upper portion of the fluid chamber, or a motor capable of rotating the magnet 163. The magnet handler and the motor may constitute the position control unit 164. Through this, the magnet 163 may rotate in a horizontal direction, clockwise or counterclockwise direction with the substrate 161.

Meanwhile, a light-transmitting bottom plate 166 may be formed in the fluid chamber 162, and the semiconductor light emitting devices may be disposed between the bottom plate 166 and the substrate 161. An image sensor 167 may be disposed to face the bottom plate 166 to monitor the inside of the fluid chamber 162 through the bottom plate 166. The image sensor 167 may be controlled by the controller 172 and may include an inverted type lens and a CCD to observe the assembly surface of the substrate 161.

The self-assembly device described above is made to use a combination of a magnetic field and an electric field, using this, the semiconductor light emitting devices can be seated at a predetermined position on the substrate by an electric field while the semiconductor light emitting devices are moved by a change in the position of the magnet. Hereinafter, the assembly process using the self-assembly apparatus described above will be described in more detail.

First, a plurality of semiconductor light emitting devices 1050 including a magnetic material are formed through the process described with reference to FIGS. 5A to 5C. In this case, in the process of forming the second conductive electrode of FIG. 5C, a magnetic material may be deposited on the semiconductor light emitting device.

Next, the substrate 161 may be transferred to the assembly position, and the semiconductor light emitting devices 1050 may be put into the fluid chamber 162 ((refer to FIG. 8A).

As described above, the assembly position of the substrate 161 may be a position in which the assembly surface of the substrate 161 on which the semiconductor light emitting devices 1050 are assembled faces downward in the fluid chamber 162.

In this case, some of the semiconductor light emitting devices 1050 may sink to the bottom of the fluid chamber 162 and some may float in the fluid. When the light-transmitting bottom plate 166 is provided in the fluid chamber 162, some of the semiconductor light emitting devices 1050 may sink to the bottom plate 166.

Next, a magnetic force may be applied to the semiconductor light emitting devices 1050 so that the semiconductor light emitting devices 1050 may vertically float in the fluid chamber 162 ((refer to FIG. 8B).

When the magnet 163 of the self-assembly device moves from its original position to the opposite surface of the assembly surface of the substrate 161, the semiconductor light emitting devices 1050 may be raised in the fluid toward the substrate 161. The original position may be a position deviated from the fluid chamber 162. As another example, the magnet 163 may be configured as an electromagnet. In this case, electricity is supplied to the electromagnet to generate an initial magnetic force.

Meanwhile, in this example, when the magnitude of the magnetic force is adjusted, the spaced distance between the assembly surface of the substrate 161 and the semiconductor light emitting devices 1050 may be controlled. For example, the spaced distance may be controlled using the weight, buoyancy, and magnetic force of the semiconductor light emitting devices 1050. The spaced distance may be several millimeters to several tens of micrometers from the outermost surface of the substrate.

Next, a magnetic force may be applied to the semiconductor light emitting devices 1050 so that the semiconductor light emitting devices 1050 may move in one direction in the fluid chamber 162. For example, the magnet 163 may move in a direction parallel to the substrate, clockwise or counterclockwise ((refer to FIG. 8C). In this case, the semiconductor light emitting devices 1050 may move in a direction parallel to the substrate 161 at a position spaced apart from the substrate 161 by the magnetic force.

Next, in the process of moving the semiconductor light emitting devices 1050, a step of inducing the semiconductor light emitting devices 1050 to the predetermined position by applying an electric field so as to be seated at a predetermined position of the substrate 161 is performed ((refer to FIG. 8C). For example, while the semiconductor light emitting devices 1050 are moving in a direction horizontal to the substrate 161, the semiconductor light emitting devices 1050 may move in a direction perpendicular to the substrate 161 to be seated at a preset position of the substrate 161 by the electric field.

More specifically, power is supplied to the bi-planar electrode of the substrate 161 to generate an electric field, and by using this, assembly may be induced only at a preset position. That is, by using the selectively generated electric field, the semiconductor light emitting devices 1050 can be self-assembled at the assembly position of the substrate 161. To this end, cells in which the semiconductor light emitting devices 1050 are inserted may be provided on the substrate 161.

After that, the unloading process of the substrate 161 may proceed, and the assembly process may be completed. When the substrate 161 is an assembly substrate, a post-process for implementing a display device by transferring the semiconductor light emitting devices arranged as described above to a wiring board may be performed.

Meanwhile, after guiding the semiconductor light emitting devices 1050 to the preset position, the magnet 163 may be moved in a direction away from the substrate 161 so that the semiconductor light emitting elements 1050 remaining in the fluid chamber 162 fall to the bottom of the fluid chamber 162 ((refer to FIG. 8D). As another example, when power supply is stopped when the magnet 163 is an electromagnet, the semiconductor light emitting devices 1050 remaining in the fluid chamber 162 may fall to the bottom of the fluid chamber 162.

Thereafter, when the semiconductor light emitting devices 1050 at the bottom of the fluid chamber 162 are recovered, the recovered semiconductor light emitting devices 1050 can be reused.

In the self-assembly device and method described above, in order to increase the assembly yield in fluidic assembly, a magnetic field may be used to concentrate distant parts near a predetermined assembly site, and a separate electric field may be applied to the assembly site so that the parts are selectively assembled only at the assembly site. At this time, the assembly board may be placed on the upper part of the water tank and the assembly surface may be directed downward to minimize the effect of gravity due to the weight of the parts and prevent non-specific binding to eliminate defects. That is, to increase the transfer yield, the assembly substrate may be placed on the upper part to minimize the influence of gravity or frictional force, and non-specific binding can be prevented.

As described above, according to the present invention having the above configuration, in a display device in which individual pixels are formed of semiconductor light emitting devices, a large number of semiconductor light emitting devices can be assembled at once.

As described above, according to the present invention, it becomes possible to pixelate a large amount of semiconductor light emitting devices on a small-sized wafer and then transfer them to a large-area substrate. Through this, it is possible to manufacture a large-area display device at a low cost.

The present invention relates to a display device using semiconductor light emitting devices including a magnetic layer extending in a longitudinal direction. Hereinafter, various embodiments of the present invention will be described with reference to the accompanying drawings.

FIG. 10 is a view showing a display device in which a semiconductor light emitting device according to an embodiment of the present invention is assembled.

The display device 1000 according to an embodiment of the present invention may include a base portion 1010 (see FIG. 12), assembly electrodes 1020, a dielectric layer 1030 (see FIG. 12), a barrier wall portion 1040, a cell 1161 formed by the barrier wall 1040, and a semiconductor light emitting device 1060 seated in the cell 1161.

The base portion 1010 may be a substrate on which the semiconductor light emitting device 1060 can be assembled, and may be, for example, a rigid substrate formed of a material such as sapphire, glass, or silicon, or a flexible substrate including polyimide (PI), etc.

The assembled electrodes 1020 may extend in one direction and may be formed on the base portion 1010 at predetermined intervals. A voltage for forming an electric field for self-assembly may be applied to the assembly electrodes 1020. By applying voltages of different polarities to the adjacent assembled electrodes 1020, an electric field may be formed between the assembled electrodes 1020.

The dielectric layer 1030 may be stacked on the base portion 1010 to cover the assembly electrodes 1020. The dielectric layer 1030 may be made of an inorganic material such as $SiO_2$, SiNx, $Al_2O_3$, $TiO_2$, $HfO_2$, and the like, but is not limited thereto.

The barrier wall portion 1040 may be stacked on the dielectric layer 1030. In detail, the barrier wall portion 1040 may be stacked on the dielectric layer 1030 while forming the cell 1161 overlapping at least a portion of the assembly electrode 1020 in the extending direction of the assembly electrode 1020. The barrier wall portion 1040 may be formed of an inorganic material such as $SiO_2$ or SiNx, or an organic material of a polymer material.

The semiconductor light emitting device 1060 may be seated inside the cell 1161 under the influence of the electric field formed by the assembled electrodes 1020. The semiconductor light emitting device 1060 may include a magnetic layer 1065 to enable self-assembly using a magnetic field and an electric field, and according to an embodiment of the present invention, the magnetic layer 1065 may have a longitudinal direction. Also, the semiconductor light emitting device 1060 may have a symmetrical structure.

According to an embodiment of the present invention, the semiconductor light emitting device 1060 may be assembled in a certain direction as shown in FIG. 10. In detail, the semiconductor light emitting device 1060 may be assembled such that the longitudinal direction of the magnetic layer 1065 may be perpendicular to the extending direction of the assembly electrodes 1020. Here, the vertical may refer to a state in which an angle between the extension direction of the assembly electrodes 1020 and the longitudinal direction of the magnetic layer 1065 is 90° or substantially 90°.

When a voltage is applied to the assembled electrodes 1020 during self-assembly, a potential difference is generated by the applied voltage, and the potential difference is induced inside the magnetic layer 1065 to be polarized in the form of an induced dipole. At this time, the polarized magnetic layer 1065 is in the most stable state when forming a vertical direction with respect to the assembled electrodes 1020, so the semiconductor light emitting devices 1060 may be assembled into the cell 1161 while having selectivity such that the longitudinal direction of the magnetic layer 1065 is perpendicular to the extending direction of the assembly electrodes 1020.

As described above, the semiconductor light emitting device 1060 constituting the display device 1000 according to the embodiment of the present invention be manufactured in a symmetrical structure, and since the magnetic layer 1065 extending in the longitudinal direction is assembled in a predetermined direction, accordingly, self-assembly speed and assembly accuracy can be improved.

Meanwhile, the top and bottom selectivity of the semiconductor light emitting device 1060 may be determined by a contact area. In detail, the semiconductor light emitting device 1060 may be assembled such that a surface having a larger area is in contact with the bottom surface of the cell 1161. Accordingly, the semiconductor light emitting device 1060 may be manufactured so that an area of a surface opposite to a surface on which an electrode pad connected to a wiring electrode, which will be described later, is formed has a larger area than that of a surface on which the electrode pad is formed. That is, the semiconductor light emitting device 1060 may be manufactured so that one surface of the first conductive electrode 1064 has a smaller area than that of another surface facing the first conductive electrode 1064. To this end, a patterning or etching process for reducing a contact area on a specific surface of the semiconductor light emitting device 1060 may be performed.

The semiconductor light emitting device 1060 according to an embodiment of the present invention may include a second conductivity type semiconductor layer 1061, an active layer 1062 formed on a portion of the second conductivity type semiconductor layer 1061, a first conductivity type semiconductor layer 1063 formed on the active layer 1062 and a first conductive electrode 1064 formed on the first conductivity type semiconductor layer 1063. Also, the magnetic layer 1065 may be formed on the second conductivity type semiconductor layer 1061.

The first conductive electrode 1064 may be an ITO or transparent electrode so that light emitted from the active layer 1062 can be transmitted to the upper surface of the semiconductor light emitting device 1060.

On the other hand, the magnetic layer 1065 may be formed of a magnetic metal material, for example, Ni, accordingly, it is possible to replace the second conductive electrode 1066 and serve as a contact metal connected to the wiring electrode. Accordingly, in this embodiment, the first conductivity type may be p-type, and the second conductivity type may be n-type, and vice versa.

Meanwhile, according to an embodiment of the present invention, the semiconductor light emitting device 1060 may selectively include the second conductive electrode 1066 formed on the second conductivity type semiconductor layer 1061. Specifically, the semiconductor light emitting device 1060 may selectively include the second conductive electrode 1066 depending on the position (upper or lower) of the magnetic layer 1065, which will be described later.

In addition, the semiconductor light emitting device 1060 according to the embodiment of the present invention may include at least one of symmetry planes among arbitrary surfaces extending along a stacking direction (or height direction) thereof, and the symmetry plane passing through a central portion C of the semiconductor light emitting device 1060 For example, the symmetrical plane may be a plane including a1 or a2 of FIGS. 11A and 14A, or a plane including an arbitrary line passing through the center C although not shown in the drawing.

The symmetrical plane may include a plane extending in the same direction as the longitudinal direction of the magnetic layer 1065, or when there is one symmetrical plane, the above-described surface, that is, a surface extending in the same direction as the longitudinal direction of the magnetic layer 1065 while passing through the central portion C of the semiconductor light emitting device 1060 may be a symmetrical plane of the semiconductor light emitting device 1060.

The symmetrical structure of the semiconductor light emitting device 1060 described above may be applied when the passivation layer 1067 is not formed on the surface of the semiconductor light emitting device 1060.

The semiconductor light emitting device 1060 according to an embodiment of the present invention may include the magnetic layer 1065 on the upper portion (first embodiment, FIGS. 11 to 13) or on the lower portion (second embodiment, FIGS. 14 to 16).

FIGS. 11A and 11B are views showing the structure of the semiconductor light emitting device according to the first embodiment of the present invention. FIG. 12 is a view showing a display device in which a semiconductor light emitting device is assembled according to the first embodiment of the present invention, and is a cross-sectional view taken along line A-A' of FIG. 10. And FIG. 13 is a diagram illustrating a wiring structure of a display device in which a semiconductor light emitting device according to a first embodiment of the present invention is assembled.

FIG. 11A shows a structure of the semiconductor light emitting device 1060 including the magnetic layer 1065 thereon according to the first embodiment as viewed from above, and FIG. 11B shows a cross-section (including the passivation layer 1067) of the semiconductor light emitting device 1060 according to the first embodiment taken along a1.

When the magnetic layer 1065 is included thereon, the semiconductor light emitting device 1060 may not include the second conductive electrode 1066. Accordingly, the magnetic layer 1065 may be electrically connected to the wiring electrode by replacing the second conductive electrode 1066 in a wiring process performed as a post-assembly process. For example, as shown in FIG. 13, the magnetic layer 1065 of the semiconductor light emitting devices 1060 arranged along the second direction (the reference column direction in the drawing) may be connected to the second wiring electrode 1070 through the second connection part 1071.

Referring to FIG. 11, the magnetic layer 1065 may be formed to pass through the central portion C of the semiconductor light emitting device 1060, and may be formed to a predetermined thickness, for example, 1 μm or more for connection with a wiring electrode. Also, at least one side of the magnetic layer 1065 may extend to an outer portion of the second conductivity type semiconductor layer 1061.

In this embodiment, the magnetic layer 1065 may be implemented by depositing a metal material that can be used as an electrode metal on the second conductivity type semiconductor layer 1061 after mesa etching.

A first conductive electrode 1064 may be formed on both sides of the magnetic layer 1065 as a reference. The first conductive electrode 1064 may also be electrically connected to the wiring electrode through a wiring process. For example, as shown in FIG. 13, the first conductive electrode 1064 of the semiconductor light emitting devices 1060 arranged in the first direction (the reference row direction in the drawing) may be connected to the first wiring electrode 1080 through the first connection part 1081.

Meanwhile, the semiconductor light emitting device 1060 may include a passivation layer 1067 on the surface. The passivation layer 1067 may be formed of an insulating material, and may prevent a short circuit between electrodes of the semiconductor light emitting device 1060 during a wiring process. Specifically, a passivation layer 1067 may be formed on the surface of the semiconductor light emitting device 1060, and only some regions connected to the wiring electrodes 1070 and 1080 may be opened.

That is, the passivation layer 1067 may include an open region 1067*b* in a portion of an overlapping region with the first conductive electrode 1064 connected to the first wiring electrode 1080, and may include the open region 1067*a* in a portion of the region overlapping the magnetic layer 1065 connected to the second wiring electrode 1070. In addition, each of the open regions may correspond to the n-type electrode pad 1067*a* and the p-type electrode pad 1067*b*.

The pad open process of forming an open region in the passivation layer 1067 may be performed with respect to a minimum region during the panel manufacturing process, and may be advantageous in securing a light emitting area and downsizing the semiconductor light emitting device 1060.

FIGS. 14A and 14B are views showing the structure of a semiconductor light emitting device according to a second embodiment of the present invention. FIG. 15 is a view showing a display device in which a semiconductor light emitting device is assembled according to a second embodiment of the present invention, and is a cross-sectional view taken along line A-A' of FIG. 10. And FIG. 16 is a diagram illustrating a wiring structure of a display device in which a semiconductor light emitting device is assembled according to a second exemplary embodiment of the present invention.

FIG. 14A shows the structure of the semiconductor light emitting device 1060 including the magnetic layer 1065 under the second embodiment as viewed from above, and FIG. 14B shows a cross section (including the passivation layer 1067) of the semiconductor light emitting device 1060 according to the second embodiment taken along a1.

When the magnetic layer 1065 is included in the lower portion, the semiconductor light emitting device 1060 may include the second conductive electrode 1066. Specifically, the second conductive electrode 1066 may be formed on one surface of the second conductivity type semiconductor layer 1061 on which the active layer 1052 is formed, and the magnetic layer 1065 may be formed on one surface of the second conductivity type semiconductor layer 1061 on which the second conductive electrode 1066 is formed and other surface of the second conductivity type semiconductor layer 1061 opposite to that of the second surface.

The second conductive electrode 1066 may be formed in the outer portion of the second conductivity type semiconductor layer 1061, and may be formed so as to form a symmetry at both outer portions of the magnetic layer 1065 formed to pass through the central portion C of the semiconductor light emitting device 1060.

The second conductive electrode 1066 may be electrically connected to the wiring electrode in a wiring process performed as a post-process of the assembly process. For example, as shown in FIG. 16, the second conductive electrode 1066 of the semiconductor light emitting devices 1060 arranged in the second direction (the reference column direction in the drawing) may be connected to the second wiring electrode 1070 through the second connection part 1071.

On the other hand, according to the second embodiment, since the magnetic layer 1065 does not function as an electrode pad, it may be formed to a thickness smaller than that of the first embodiment, for example, 1 µm or less. Also, it is not necessary to extend to the outer portion of the second conductivity type semiconductor layer 1061 under the symmetrical structure. In particular, since the magnetic layer 1065 absorbs light emitted from the light emitting surface and causes light loss, it is preferable to configure the thickness of the magnetic layer 1065 to be thinner in this embodiment to minimize light loss.

In this embodiment, the magnetic layer 1065 may be formed through an etching and deposition process after forming a PR pattern by fixing the semiconductor light emitting device 1060 separated through a laser lift off (LLO) process to a rigid substrate.

In addition, the second conductive electrode 1066 may be implemented by depositing a metal after mesa-etching a minimum area on the outer portion of the second conductivity type semiconductor layer 1061, The shape is not particularly limited, such as a circular shape or an oval shape.

The first conductive electrode 1064 may be formed on both sides of the magnetic layer 1065 as a reference. The first conductive electrode 1064 may also be electrically connected to the wiring electrode through a wiring process. For example, as shown in FIG. 16, the first conductive electrode 1064 of the semiconductor light emitting devices 1060 arranged in the first direction (the reference row direction in the drawing) may be connected to the first wiring electrode 1080 through the first connection part 1081.

On the other hand, the semiconductor light emitting device 1060 may include a passivation layer 1067 on the surface, and the passivation layer 1067 may have an open form only in some regions connected to the wiring electrodes 1070 and 1080 in the wiring process.

In this embodiment, the passivation layer 1067 may include an open region 1067b in a portion of an overlapping region with the first conductive electrode 1064 connected to the first wiring electrode 1080, and may include an open region 1067a in a portion of a region overlapping the second conductive electrode 1066 connected to the second wiring electrode 1070. The open regions may correspond to the n-type electrode pad 1067a and the p-type electrode pad 1067b, respectively.

The structure of the semiconductor light emitting device 1060 according to the first and second embodiments of the present invention can maximize the light emitting area by not only efficiently aligning the semiconductor light emitting device 1060 but also using a minimum area as an n-type electrode pad. Accordingly, there is an advantageous effect in miniaturization of the semiconductor light emitting device 1060.

FIG. 17 is a view FIGS. 17A to 17C are views showing the structure of a semiconductor light emitting device according to various embodiments of the present invention. According to various embodiments of the present disclosure, the semiconductor light emitting device 1060 may further include various functional layers.

The semiconductor light emitting device 1060 according to the present invention may further include a configuration for improving the adhesion of the magnetic layer 1065 in order to prevent the magnetic layer 1065 from being peeled off during the assembly process FIG. 17A and FIG. 17B).

First, as shown in FIG. 17A, the semiconductor light emitting device 1060 may further include an auxiliary bonding layer 1068 between the magnetic layer 1065 and the second conductivity type semiconductor layer 1061. For example, the auxiliary bonding layer 1068 may be formed of Cr, Ti, or another material having similar properties.

Alternatively, as shown in FIG. 17B, the magnetic layer 1065 and the second conductivity type semiconductor layer 1061 may include a concave-convex structure on opposite surfaces of each other, through the concave-convex structure, the contact area between the magnetic layer 1065 and the second conductivity type semiconductor layer 1061 may be maximized to enhance adhesion.

Meanwhile, the semiconductor light emitting device 1060 according to the present invention may further include a configuration for increasing the amount of extracted light FIG. 17C).

The semiconductor light emitting device 1060 may further include a reflective layer 1069 between the second conductive electrode 1066 and the second conductivity type semiconductor layer 1061. The reflective layer 1069 may be made of Ti, Al, a Ti/Al alloy, or another material having similar properties. For example, the reflective layer 1069 may prevent light leakage through the side surface of the semiconductor light emitting device 1060 and increase the amount of extracted light by reflecting light emitted laterally downward.

Needless to say, all of the above configurations may be applied to the structure of the semiconductor light emitting device 1060 according to the first and second embodiments.

The above-described present invention is not limited to the configuration and method of the embodiments described above, but the embodiments may be configured by selectively combining all or part of each embodiment so that various modifications can be made.

The invention claimed is:
1. A display device comprising:
a base part;
a plurality of assembly electrodes extending in a first direction and disposed at predetermined intervals on the base part;
a dielectric layer stacked on the base part to cover the plurality of assembly electrodes;
a barrier wall portion stacked on the dielectric layer to define a cell overlapping at least a portion of the plurality of assembly electrodes along the first direction of the plurality of assembly electrodes; and a plurality of semiconductor light emitting devices disposed in the cell,
wherein the plurality of semiconductor light emitting devices comprise a magnetic layer extending in a longitudinal direction vertical to the first direction,
wherein the plurality of semiconductor light emitting devices respectively comprise a light emitting structure,
wherein the light emitting structure comprises a recessed portion intersecting a center portion of the light emitting structure, and
wherein the magnetic layer is disposed in the recessed portion of the light emitting structure.

2. The display device according to claim 1, wherein the plurality of semiconductor light emitting devices respectively comprise:
a second conductivity type semiconductor layer;
an active layer disposed on a portion of the second conductivity type semiconductor layer; and
a first conductivity type semiconductor layer disposed on the active layer, and
wherein the magnetic layer is disposed on the second conductivity type semiconductor layer.

3. The display device according to claim 2, wherein the plurality of semiconductor light emitting devices respectively comprise a symmetrical plane among arbitrary surfaces extending along a stacking direction of the plurality of semiconductor light emitting devices, and
wherein the symmetrical plane passes through a central portion of the plurality of semiconductor light emitting devices.

4. The display device according to claim 3, wherein the symmetrical plane extends in the same direction as the longitudinal direction of the magnetic layer.

5. The display device according to claim 2, wherein the plurality of semiconductor light emitting devices respectively comprise a first conductive electrode disposed on the first conductivity type semiconductor layer and a second conductive electrode disposed on the second conductivity type semiconductor layer.

6. The display device according to claim 5, wherein the second conductive electrode is disposed on one surface of the second conductivity type semiconductor layer on which the active layer is disposed,
wherein the magnetic layer is disposed on another surface of the second conductivity type semiconductor layer opposite to the one surface, and
wherein the display device further comprises a first wiring electrode connecting the first conductive electrodes of the semiconductor light emitting devices arranged in the first direction and a second wiring electrode connecting the second conductive electrodes of the semiconductor light emitting devices arranged in a second direction.

7. The display device according to claim 5, wherein the magnetic layer is disposed on one surface of the second conductivity type semiconductor layer on which the active layer is disposed, and
wherein the display device further comprises a first wiring electrode connecting the first conductive electrodes of the semiconductor light emitting devices arranged in the first direction and a second wiring electrode connecting the magnetic layers of the semiconductor light emitting devices arranged in a second direction.

8. The display device according to claim 5, wherein the second conductive electrode is disposed on an outer portion of the second conductivity type semiconductor layer.

9. The display device according to claim 5, wherein an area of one surface at a side of the first conductive electrode of the plurality of semiconductor light emitting devices is smaller than an area of another surface facing the one surface.

10. The display device according to claim 2, wherein the plurality of semiconductor light emitting devices respectively further comprise an auxiliary bonding layer between the magnetic layer and the second conductivity type semiconductor layer.

11. The display device according to claim 2, wherein each of the magnetic layer and the second conductivity type semiconductor layer comprises a concave-convex structure on surfaces facing each other.

12. The display device according to claim 5, wherein the plurality of semiconductor light emitting devices respectively further comprise a reflective layer between the second conductive electrode and the second conductivity type semiconductor layer.

13. The display device according to claim 1, wherein the plurality of semiconductor light emitting devices are assembled such that the longitudinal direction of the magnetic layer is perpendicular to an extending direction of the plurality of assembly electrodes that is parallel to the first direction.

14. The display device according to claim 3, wherein the symmetrical plane includes a plane including an arbitrary line passing through the central portion of the plurality of semiconductor light emitting devices.

15. The display device according to claim 8, wherein the second conductive electrode includes a pair of second conductive electrodes and each of the paired second conductive electrodes is disposed symmetrical along the longitudinal direction of the magnetic layer.

16. The display device according to claim 1, wherein the cell is provided in a plurality, and
wherein the plurality of semiconductor light emitting devices are disposed in the plurality of cells, respectively.

17. The display device according to claim 1, wherein the plurality of semiconductor light emitting devices respectively comprise a passivation layer disposed on a surface of each of the plurality semiconductor light emitting devices,
wherein the passivation layer covers the magnetic layer, and
wherein a portion of the passivation layer is in the recessed portion of the light emitting structure.

18. A display device comprising:
a plurality of assembly electrodes separated from each other, and extending in a first direction;
a dielectric layer covering the plurality of assembly electrodes;
a barrier wall portion on the dielectric layer defining a plurality of cells; and
a plurality of semiconductor light emitting devices disposed in the plurality of cell, respectively,
wherein each of the plurality of semiconductor light emitting devices comprises a magnetic strip extending from one side to an opposite side of each semiconductor light emitting devices
wherein each of the plurality of semiconductor light emitting devices comprises a light mitting structure,
wherein the light emitting structure comprises a recessed portion, and
wherein the magnetic strip is disposed in the recessed portion of the light emitting structure.

19. The display device of according to claim 18, wherein the magnetic strip extends in a second direction that intersects the first direction.

20. The display device according to claim 1, wherein the light emitting structure includes at least one of a substrate, an active layer, a conductive type semiconductor layer and a conductive electrode.

* * * * *